(12) United States Patent
Kim et al.

(10) Patent No.: US 11,430,968 B2
(45) Date of Patent: Aug. 30, 2022

(54) DISPLAY DEVICE INCLUDING FILLING LAYER SURROUNDING A COLUMN SPACER

(71) Applicant: Samsung Display Co., Ltd., Yongin-si (KR)

(72) Inventors: Yohan Kim, Seoul (KR); Jongjin Park, Cheonan-si (KR); Won Min Yun, Yongin-si (KR); Seungju Lee, Incheon (KR); Sumin Jung, Seongnam-si (KR); Young Cheol Joo, Hwaseong-si (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/999,726

(22) Filed: Aug. 21, 2020

(65) Prior Publication Data

US 2021/0217990 A1 Jul. 15, 2021

(30) Foreign Application Priority Data

Jan. 9, 2020 (KR) .................. 10-2020-0003329

(51) Int. Cl.
*H01L 27/32* (2006.01)
*H01L 51/50* (2006.01)
(Continued)

(52) U.S. Cl.
CPC ........ *H01L 51/5253* (2013.01); *H01L 51/525* (2013.01); *G02F 1/13394* (2013.01);
(Continued)

(58) Field of Classification Search
CPC ............... H01L 51/5253; H01L 51/525; H01L 51/5246; H01L 51/5237; H01L 51/5284;
(Continued)

(56) References Cited

U.S. PATENT DOCUMENTS

2014/0042408 A1\* 2/2014 Akagawa ................ H01L 51/56
257/40
2018/0120631 A1\* 5/2018 Lee .................... G02F 1/133555
(Continued)

FOREIGN PATENT DOCUMENTS

KR 10-1226440 B1 1/2013
KR 10-1273890 B1 6/2013
(Continued)

OTHER PUBLICATIONS

Lee, Sung-jun et al.; "Anti-Reflective Coating with Hydrophilic/Abraion-Resistant Properties using $TiO_2/SiO_xC_y$ Double-Layer Thin Film"; J. Korean Inst. Surf. Eng.; vol. 50; No. 5; 2-17; pp. 345-351, 2017.

*Primary Examiner* — Ida M Soward
(74) *Attorney, Agent, or Firm* — Lewis Roca Rothgerber Christie LLP

(57) ABSTRACT

A display device, including: a display panel including a light emitting element and an encapsulation layer covering the light emitting element; a color conversion panel overlapping the display panel, the color conversion panel including a color conversion element; a column spacer between the display panel and the color conversion panel; a filling layer filling a space between the display panel and the color conversion panel and surrounding the column spacer; and a buffer layer between the column spacer and the encapsulation layer of the display panel, the buffer layer including silicon oxycarbide (SiOxCy).

18 Claims, 5 Drawing Sheets

(51) Int. Cl.
*H01L 51/52* (2006.01)
*G02F 1/13* (2006.01)
*G02F 1/1362* (2006.01)
*G02F 1/1335* (2006.01)
*G02F 1/1339* (2006.01)

(52) U.S. Cl.
CPC .. *G02F 1/133512* (2013.01); *G02F 1/133514* (2013.01); *G02F 1/133528* (2013.01); *G02F 1/136209* (2013.01); *G09G 2300/0452* (2013.01); *H01L 27/322* (2013.01); *H01L 27/3272* (2013.01); *H01L 51/502* (2013.01); *H01L 51/5293* (2013.01); *H01L 2251/301* (2013.01)

(58) Field of Classification Search
CPC ............. H01L 51/5293; H01L 51/502; H01L 2251/301; H01L 27/322; H01L 27/3211; H01L 27/3246; H01L 27/3248; H01L 27/3258; H01L 27/3262; H01L 27/3272; G02F 1/136209; G02F 1/133512; G02F 1/13394; G02F 1/133514; G02F 1/133528; G09G 2300/0452

See application file for complete search history.

(56) References Cited

U.S. PATENT DOCUMENTS

| | | | | |
|---|---|---|---|---|
| 2019/0121176 | A1* | 4/2019 | Lee | G02F 1/1336 |
| 2019/0310522 | A1* | 10/2019 | Chu | G02F 1/133617 |
| 2020/0133077 | A1* | 4/2020 | Lin | G02F 1/133609 |
| 2020/0168663 | A1* | 5/2020 | Choi | H01L 33/145 |
| 2020/0365566 | A1* | 11/2020 | Zhang | H01L 33/0075 |
| 2021/0111312 | A1* | 4/2021 | Chang | H01L 33/405 |
| 2021/0111366 | A1* | 4/2021 | Chang | H01L 51/56 |
| 2022/0019758 | A1* | 1/2022 | Jia | G06V 40/1318 |

FOREIGN PATENT DOCUMENTS

| | | |
|---|---|---|
| KR | 10-2017-0036160 A | 4/2017 |
| KR | 10-2017-0103060 A | 9/2017 |
| KR | 10-2019-0077878 A | 7/2019 |

* cited by examiner

DISPLAY DEVICE INCLUDING FILLING LAYER SURROUNDING A COLUMN SPACER

CROSS-REFERENCE TO RELATED APPLICATION

The present application claims priority to and the benefit of Korean Patent Application No. 10-2020-0003329 filed on Jan. 9, 2020 in the Korean Intellectual Property Office (KIPO), the entire disclosure of which is incorporated by reference herein.

BACKGROUND

1. Field

Aspects of some example embodiments of the present disclosure relate to a display device.

2. Description of the Related Art

Display devices include, for example, liquid crystal display devices, organic light emitting diode display devices, plasma display panel devices, electrophoretic display devices, or the like, based on a light emitting scheme thereof. Among such display devices, the organic light emitting diode display device is garnering attention as an ideal next generation display device because it has relatively excellent display characteristics in terms of a contrast ratio and a response time, and may be utilized as a flexible display device.

To realize a display device having high color reproducibility while decreasing light loss, a display device including a color conversion panel may be utilized.

The above information disclosed in this Background section is only for enhancement of understanding of the background and therefore the information discussed in this Background section does not necessarily constitute prior art.

SUMMARY

Aspects of some example embodiments of the present disclosure relate to a display device. For example, aspects of some example embodiments relate to a display device including a color conversion panel.

Aspects of some example embodiments include a display device in which dent defects of a display panel are prevented or reduced.

Aspects of some example embodiments include a display device in which dent defects of a color conversion panel are prevented or reduced.

A display device according to some example embodiments may include a display panel including a light emitting element and an encapsulation layer covering the light emitting element, a color conversion panel overlapping the display panel, the color conversion panel including a color conversion element, a column spacer between the display panel and the color conversion panel, a filling layer filling a space between the display panel and the color conversion panel and surrounding the column spacer, and a buffer layer between the column spacer and the encapsulation layer of the display panel, the buffer layer including silicon oxycarbide ($SiO_xC_y$).

According to some example embodiments, the encapsulation layer may include an inorganic encapsulation layer contacting the buffer layer, and an elastic modulus of the buffer layer may be less than an elastic modulus of the inorganic encapsulation layer.

According to some example embodiments, a hardness of the buffer layer may be less than a hardness of the inorganic encapsulation layer.

According to some example embodiments, an elastic modulus of the buffer layer may be less than or equal to about 3.0 GPa.

According to some example embodiments, a hardness of the buffer layer may be less than or equal to about 0.4 GPa.

According to some example embodiments, a thickness of the buffer layer may be greater than about 0.5 μm.

According to some example embodiments, the encapsulation layer may include an inorganic encapsulation layer contacting the buffer layer, and a difference between a refractive index of the buffer layer and a refractive index of the inorganic encapsulation layer may be less than about 0.05.

According to some example embodiments, a refractive index of the buffer layer may be greater than or equal to about 1.5 and less than or equal to about 1.9.

According to some example embodiments, an atomic ratio of oxygen to silicon in the buffer layer may be greater than or equal to about 0.6 and less than or equal to about 0.63.

According to some example embodiments, an atomic ratio of carbon to silicon in the buffer layer may be greater than or equal to about 1.24 and less than or equal to about 1.30.

According to some example embodiments, wrinkles may be formed on a surface of the buffer layer that contacts the column spacer.

According to some example embodiments, an average width of the wrinkles may be about 0.01 μm to about 5 μm.

According to some example embodiments, the buffer layer may include a first sub-buffer layer contacting the encapsulation layer and having a first elastic modulus, a second sub-buffer layer contacting the column spacer and having a second elastic modulus, and a third sub-buffer layer between the first sub-buffer layer and the second sub-buffer layer, and the third sub-buffer layer having a third elastic modulus greater than the first elastic modulus and the second elastic modulus.

According to some example embodiments, the second elastic modulus may be less than the first elastic modulus.

According to some example embodiments, the column spacer may include a plurality of sub-column spacers.

According to some example embodiments, the color conversion panel may further include black matrix surrounding the color conversion element.

According to some example embodiments, the column spacer may be between the buffer layer and the black matrix.

According to some example embodiments, the column spacer may be between the color conversion element and the black matrix.

A display device according to some example embodiments may include a display panel including a light emitting element, a color conversion panel overlapping the display panel, the color conversion panel including a color conversion element and a protective layer covering the color conversion element, a column spacer between the display panel and the color conversion panel, a filling layer filling a space between the display panel and the color conversion panel and surrounding the column spacer, and a buffer layer between the column spacer and the protective layer of the color conversion panel, the buffer layer including silicon oxycarbide ($SiO_xC_y$).

According to some example embodiments, the protective layer may include at least one of silicon nitride ($SiN_x$), silicon oxide ($SiO_2$), or silicon oxynitride ($SiO_xN_y$).

The display device according to some example embodiments may include a buffer layer located between the column spacer and the encapsulation layer of the display panel or between the column spacer and the protective layer of the color conversion panel, and including silicon oxycarbide ($SiO_xC_y$). Accordingly, dent defects of the display panel or the color conversion panel that may otherwise occur due to the column spacer may be prevented or reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, further details of display devices according to some example embodiments will be explained in more detail with reference to the accompanying drawings.

Figure 1:
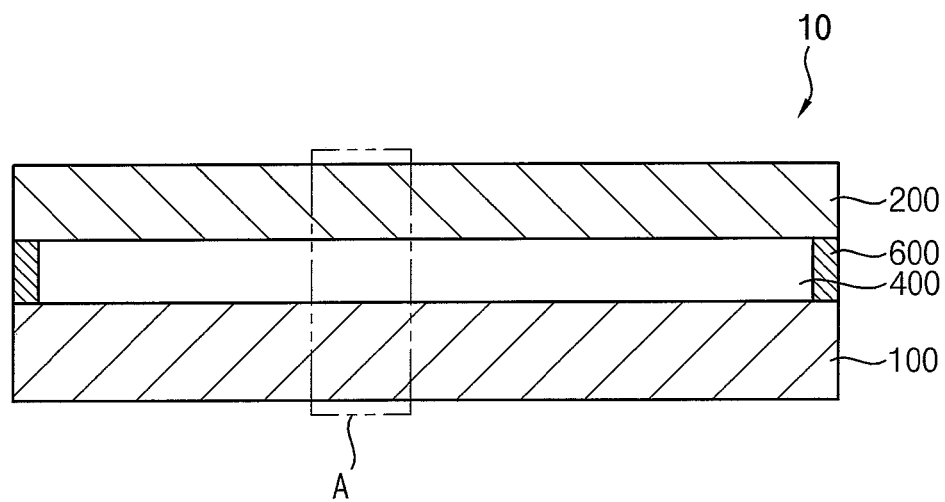
FIG. 1 is a cross-sectional view illustrating a display device according to some example embodiments.

FIG. 1 is a cross-sectional view illustrating a display device according to some example embodiments.

Referring to FIG. 1, a display device 10 according to some example embodiments may include a display panel 100, a color conversion panel 200, a filling layer 400, and a sealant 600.

The display panel 100 may provide light having a first color to the color conversion panel 200. According to some example embodiments, the first color may be blue.

The color conversion panel 200 may overlap the display panel 100. The color conversion panel 200 may be arranged or located on the display panel 100. The color conversion panel 200 may convert the light having the first color provided from the display panel 100 into light having a second color or light having a third color, or may transmit the light having the first color. According to some example embodiments, the second color may be red, and the third color may be green.

The filling layer 400 may fill a space between the display panel 100 and the color conversion panel 200. In a process of manufacturing the display device 10, the display panel 100 and the color conversion panel 200 may be pressed with a filler in between after the filler is applied between the display panel 100 and the color conversion panel 200 to form the display device 10 including the display panel 100, the color conversion panel 200, and the filling layer 400 located therebetween.

The sealant 600 may be located between a side of the display panel 100 and a side of the color conversion panel 200. The side of the display panel 100 and the side of the color conversion panel 200 may be combined by the sealant 600, and a space between the display panel 100 and the color conversion panel 200 may be sealed. The sealant 600 may prevent or reduce instances of impurities such as oxygen, moisture, or the like permeating into the display device 10 from outside.

Figure 2:
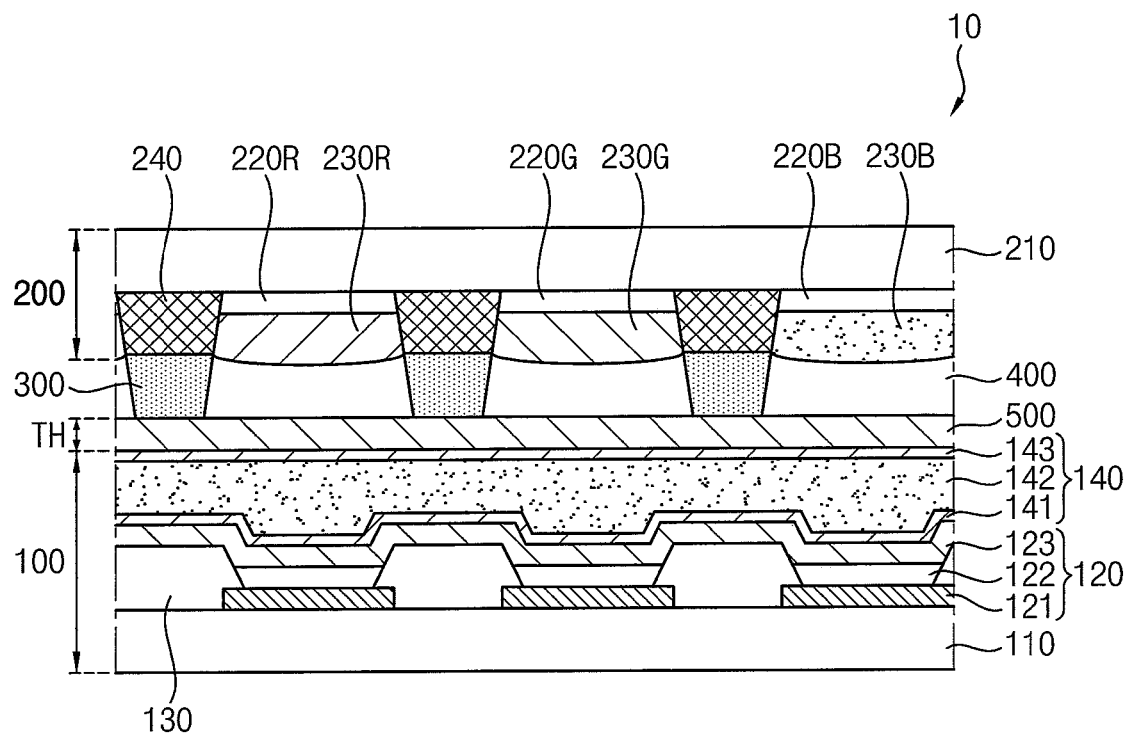
FIG. 2 is a cross-sectional view illustrating an area A in FIG. 1.

FIG. 2 is a cross-sectional view illustrating an area A in FIG. 1.

Referring to FIG. 2, the display device 10 may include the display panel 100, the color conversion panel 200, a column spacer 300, the filling layer 400, and a buffer layer 500.

The display panel 100 may include a transistor substrate 110, a light emitting element 120, a pixel defining layer 130, and an encapsulation layer 140.

The transistor substrate 110 may include a substrate and a circuit element arranged or formed on the substrate. The circuit element may include a transistor, capacitor, or the like. The circuit element may include a semiconductor layer and conductive layers formed on the substrate, and insulation layers located between the semiconductor layer and the conductive layers. The circuit element may transmit signal for driving the light emitting element 120 to the light emitting element 120. According to some example embodiments, the circuit element may transmit a driving current to the light emitting element 120.

The light emitting element 120 may be arranged or formed on the transistor substrate 110. The light emitting element 120 may include a pixel electrode 121, an emission layer 122, and an opposite electrode 123.

The pixel electrode 121 may be arranged or formed on the transistor substrate 110. The pixel electrode 121 may be electrically connected to the circuit element of the transistor substrate 110.

The pixel defining layer 130 partially covering the pixel electrode 121 may be arranged or formed on the transistor substrate 110. According to some example embodiments, the pixel defining layer 130 may cover a peripheral portion of the pixel electrode 121 and may expose a central portion of the pixel electrode 121.

The emission layer 122 may be arranged or formed on the central portion of the pixel electrode 121 exposed by the pixel defining layer 130. According to some example embodiments, the emission layer 122 may include an organic light emitting material. The organic light emitting material may include a low molecular weight polymer or a high molecular weight polymer. For example, the low molecular weight polymer may include copper phthalocyanine, N,N'-diphenylbenzidine, tris-(8-hydroxyquinoline)aluminum, etc., and the high molecular weight polymer may include poly(3,4-ethylenedioxythiophene), polyaniline, poly-phenylenevinylene, polyfluorene, etc.

The opposite electrode 123 may be arranged or formed on the emission layer 122. The opposite electrode 123 may be opposite to the pixel electrode 121 with the emission layer 122 in between. The opposite electrode 123 may also be arranged or formed on the pixel defining layer 130.

A plurality of light emitting elements 120 may be arranged or formed on the transistor substrate 110. The light emitting elements 120 may be spaced apart from each other by the pixel defining layer 130. The pixel defining layer 130 may surround the light emitting elements 120.

According to some example embodiments, each of the light emitting elements 120 may emit blue light. The blue light emitted from each of the light emitting elements 120 may be provided to the color conversion panel 200.

The encapsulation layer 140 may be arranged or formed on the light emitting element 120. The encapsulation layer 140 may cover or encapsulate the light emitting element 120 to protect the light emitting element 120 from external oxygen, moisture, or the like.

The encapsulation layer 140 may have a multilayer structure including at least one inorganic encapsulation layer and at least one organic encapsulation layer. The inorganic encapsulation layer and the organic encapsulation layer of the encapsulation layer 140 may be alternatively layered. Each of the lowermost layer and the uppermost layer of the encapsulation layer 140 having the multilayer structure may be an inorganic encapsulation layer.

According to some example embodiments, the encapsulation layer 140 may include a first inorganic encapsulation layer 141, an organic encapsulation layer 142, and a second inorganic encapsulation layer 143. However, embodiments according to the present invention are not limited thereto, and according to some example embodiments, the encapsulation layer 140 may include at least three inorganic encapsulation layers and at least two organic encapsulation layers.

The first inorganic encapsulation layer 141 may be arranged or formed on the opposite electrode 123. The first inorganic encapsulation layer 141 may be formed along a profile of an upper surface of the opposite electrode 123. The first inorganic encapsulation layer 141 may include silicon nitride, silicon oxide, silicon oxynitride, or the like.

The organic encapsulation layer 142 may be arranged or formed on the first inorganic encapsulation layer 141. The organic encapsulation layer 142 may have a planarized upper surface.

The second inorganic encapsulation layer 143 may be arranged or formed on the organic encapsulation layer 142. The second inorganic encapsulation layer 143 may be formed along a profile of an upper surface of the organic encapsulation layer 142. Accordingly, the second inorganic encapsulation layer 143 may have a planarized upper surface. The second inorganic encapsulation layer 143 may include silicon nitride, silicon oxide, silicon oxynitride, or the like.

The color conversion panel 200 may include a base substrate 210, a color filter 220R, 220G, and 220B, a color conversion element 230R, 230G, and 230B, and a black matrix 240.

The color conversion element 230R, 230G, and 230B may be arranged or formed between the display panel 100 and the base substrate 210, and the color filter 220R, 220G, and 220B may be arranged or formed between the color conversion element 230R, 230G, and 230B and the base substrate 210. The color conversion element 230R, 230G, and 230B may overlap the light emitting element 120 (e.g., in a direction perpendicular or normal with respect to a plane of the display surface).

The color filter 220R, 220G, and 220B may transmit light having a specific wavelength band, and may absorb light having other wavelength bands. The color filter 220R, 220G, and 220B may include a first color filter 220R, a second color filter 220G, and a third color filter 220B. The first color filter 220R may transmit only red light, the second color filter 220G may transmit only green light, and the third color filter 220B may transmit only blue light. Accordingly, the color purity of the color conversion panel 200 may be improved.

The first color filter 220R may absorb the green light and the blue light, the second color filter 220G may absorb the blue light and the red light, and the third color filter 220B may absorb the red light and the green light. Accordingly, the color filter 220R, 220G, and 220B may minimize or reduce reflection of external light. The display device 10 may omit a polarizing plate that may otherwise be utilized to prevent or reduce the reflection of external light, and thus, a thickness of the display device 10 may be relatively decreased.

The color conversion element 230R, 230G, and 230B may convert a wavelength of incident light to generate light having another wavelength, or may transmit the incident light. The color conversion element 230R, 230G, and 230B may include a first color conversion element 230R, a second color conversion element 230G, and a third color conversion element 230B. The first color conversion element 230R may convert a wavelength of incident blue light to generate red light, the second color conversion element 230G may convert a wavelength of incident blue light to generate green light, and the third color conversion element 230B may transmit incident blue light. The first color conversion element 230R, the second color conversion element 230G, and the third color conversion element 230B may be spaced apart from each other.

Each of the first color conversion element 230R and the second color conversion element 230G may include an emitter and a scatterer. According to some example embodiments, a quantum dot may be used as the emitter. The quantum dot may absorb light incident thereto and may emit light having a different wavelength from a wavelength of the incident light. In other words, the quantum dot may be a wavelength converting particle that converts the wavelength of light incident to the quantum dot. A wavelength range of light the quantum dot converts may vary depending on the size of the quantum dot. For example, by adjusting the diameter of the quantum dot, the quantum dot may emit light of a desired or intended color according to the design of the display device.

The quantum dot may have a structure including a core nanocrystal and a shell nanocrystal surrounding the core nanocrystal. Further, the quantum dot may include an organic ligand bonded to the shell nanocrystal. The shell nanocrystal may include a plurality of layers. The shell nanocrystal may be arranged or formed on a surface of the core nanocrystal.

The quantum dot may include at least one of: Group II compound semiconductors, Group III compound semiconductors, Group IV compound semiconductors, Group V compound semiconductors, or Group VI compound semiconductors. For example, the quantum dot may be selected from: Group II-VI compounds, Group III-V compounds, Group IV-VI compounds, Group IV elements, Group IV compounds, and combinations thereof.

The first color conversion element 230R may include a red emitter emitting red light, and the second color conversion element 230G may include a green emitter emitting green light. For example, the red emitter may absorb blue light to generate the red light, and the green emitter may absorb the blue light to generate the green light.

The scatterer may scatter light incident to the first color conversion element 230R and the second color conversion element 230G, thereby improving the light conversion efficiency of the first color conversion element 230R and the second color conversion element 230G and substantially minimizing color deviation according to the viewing angle. The scatterer may include at least one of $TiO_2$, $SiO_2$, or ZnO.

According to some example embodiments, the first color conversion element 230R and the second color conversion element 230G may include the same scatterer. However, embodiments according to the present invention are not limited thereto, and according to some example embodiments, the first color conversion element 230R and the second color conversion element 230G may include different scatterers.

The third color conversion element 230B may include a scatterer. The scatterer may scatter light incident to the third color conversion element 230B, thereby increasing the amount of light emitted from the third color conversion element 230B and substantially minimizing color deviation according to the viewing angle. The scatterer may include at least one of $TiO_2$, $SiO_2$, or ZnO. According to some example embodiments, the third color conversion element 230B may include a scatter substantially the same as those included in the first color conversion element 230R and the second color conversion element 230G. However, embodiments according to the present invention are not limited thereto, and according to some example embodiments, the third color conversion element 230B may include a scatter different from those included in the first color conversion element 230R and the second color conversion element 230G.

The black matrix 240 may be arranged or formed between the color conversion elements 230R, 230G, and 230B. In other words, the color conversion elements 230R, 230G, and 230B may be spaced apart from each other by the black matrix 240. The black matrix 240 may overlap the pixel defining layer 130.

The black matrix 240 may block light incident thereto. The black matrix 240 may prevent or reduce color mixture between light having different colors emitted from color conversion elements 230R, 230G, and 230B. The black matrix 240 may include carbon black, chromium oxide, or the like.

The column spacer 300 may be arranged or formed between the display panel 100 and the color conversion panel 200. The column spacer 300 may maintain a constant distance between the display panel 100 and the color conversion panel 200. When a distance between the display panel 100 and the color conversion panel 200 is not uniform throughout the display device 10, the brightness of light emitted from the display device 10 may not be uniform throughout the display device 10. Because the column spacer 300 is arranged or formed between the display panel 100 and the color conversion panel 200, a distance between the display panel 100 and the color conversion panel 200 may be uniform throughout the display device 10. Therefore, the brightness of light emitted from the display device 10 may be uniform throughout the display device 10.

The column spacer 300 may be arranged or formed between the buffer layer 500 and the black matrix 240 of the color conversion panel 200. The column spacer 300 may be formed on the black matrix 240 in a process of manufacturing the color conversion panel 200.

According to some example embodiments, the column spacer 300 may have a trapezoidal cross-sectional shape. For example, the column spacer 300 may have a trapezoid shape whose width decreases in a direction from the color conversion panel 200 to the display panel 100 in a cross-sectional view.

The filling layer 400 may fill a space between the display panel 100 and the color conversion panel 200, and may surround the column spacer 300. According to some example embodiments, the filling layer 400 may have a viscosity of about 10 cps to about 9000 cps, and may have a refractive index of about 1.5 or more.

The display panel 100 and the color conversion panel 200 may be pressed with a filler in between after the filler is applied between the display panel 100 and the color conversion panel 200 on which the column spacer 300 is formed to form the display device 10 in which the display panel 100 and the color conversion panel 200 maintain a constant distance by the column spacer 300 and the filling layer 400 is formed between the display panel 100 and the color conversion panel 200. In this case, the column spacer 300 may contact the encapsulation layer 140 of the display panel 100, and dent defects may occur in the encapsulation layer 140 of the display panel 100 as the second inorganic encapsulation layer 143 of the encapsulation layer 140 is stabbed by the column spacer 300. To prevent or reduce dent defects in the encapsulation layer 140 of the display panel 100, the buffer layer 500 may be arranged or formed between the column spacer 300 and the display panel 100.

The buffer layer 500 may be arranged or formed between the column spacer 300 and the encapsulation layer 140 of the display panel 100. The buffer layer 500 may include silicon oxycarbide ($SiO_xC_y$). The buffer layer 500 may serve as a buffer member that blocks or absorbs an impact to the encapsulation layer 140 of the display panel 100 by the column spacer 300.

The buffer layer 500 may be formed on the encapsulation layer 140 of the display panel 100 before the display panel 100 and the color conversion panel 200 are combined. According to some example embodiments, the buffer layer 500 may be formed by a plasma enhanced chemical vapor deposition (PECVD). For example, the buffer layer 500 may be formed under a condition of about 100° C. or less. In order to form the buffer layer 500 including silicon oxycarbide, hexamethyldisiloxane (HMDSO) may be used as a deposition source. As a dissociation gas of hexamethyldisiloxane (HMDSO), for example, $N_2O$, $O_2$, or the like may be used.

The buffer layer 500 may have a relatively low elastic modulus to block or absorb the impact by the column spacer 300. According to some example embodiments, an elastic modulus of the buffer layer 500 may be less than an elastic modulus of an inorganic encapsulation layer of the encapsulation layer 140 that contacts the buffer layer 500. For example, the elastic modulus of the buffer layer 500 may be less than an elastic modulus of the second inorganic encapsulation layer 143 of the encapsulation layer 140.

According to some example embodiments, the elastic modulus of the buffer layer 500 may be less than or equal to about 3.0 GPa. When the elastic modulus of the buffer layer 500 is greater than about 3.0 GPa, the buffer layer 500 may not block or absorb the impact by the column spacer 300 enough, therefore, dent defects may occur in the encapsulation layer 140 of the display panel 100 by the column spacer 300.

According to some example embodiments, a hardness of the buffer layer 500 may be less than a hardness of an inorganic encapsulation layer of the encapsulation layer 140 that contacts the buffer layer 500. For example, the hardness of the buffer layer 500 may be less than a hardness of the second inorganic encapsulation layer 143 of the encapsulation layer 140.

According to some example embodiments, the hardness of the buffer layer 500 may be less than or equal to about 0.4 GPa. When the hardness of the buffer layer 500 is greater than about 0.4 GPa, the buffer layer 500 may not block or absorb the impact by the column spacer 300 enough, therefore, dent defects may occur in the encapsulation layer 140 of the display panel 100 by the column spacer 300.

According to some example embodiments, a thickness TH of the buffer layer 500 may be greater than about 0.5 µm. When the thickness TH of the buffer layer 500 is less than or equal to about 0.5 µm, the buffer layer 500 may not block or absorb the impact by the column spacer 300 enough, therefore, dent defects may occur in the encapsulation layer 140 of the display panel 100 by the column spacer 300.

According to some example embodiments, an atomic ratio of oxygen to silicon in the buffer layer 500 may be greater or equal to about 0.6 and less than or equal to about 0.63. Further, an atomic ratio of carbon to silicon in the buffer layer 500 may be greater or equal to about 1.24 and less than or equal to about 1.30. Because the atomic ratio of oxygen to silicon in the buffer layer 500 has the above-described range, and atomic ratio of carbon to silicon in the buffer layer 500 has the above-described range, the elastic modulus of the buffer layer 500 may be less than or equal to about 3.0 GPa, and the hardness of the buffer layer 500 may be less than or equal to about 0.4 GPa. Accordingly, the buffer layer 500 may prevent or reduce damage to the encapsulation layer 140 of the display panel 100 that may otherwise be caused by the column spacer 300.

According to some example embodiments, a difference between a refractive index of the buffer layer 500 and a refractive index of an inorganic encapsulation layer of the encapsulation layer 140 that contacts the buffer layer 500 may be less than about 0.05. For example, a difference between the refractive index of the buffer layer 500 and a refractive index of the second encapsulation layer 143 of the encapsulation layer 140 may be less than about 0.05. The buffer layer 500 may be arranged or formed on the encapsulation layer 140 that covers the light emitting element 120, therefore, light having the first color emitted from the light emitting element 120 may pass through the encapsulation layer 140 and the buffer layer 500. Because the difference between the refractive index of the buffer layer 500 and the refractive index of the inorganic encapsulation layer of the encapsulation layer 140 that contacts the buffer layer 500 is less than about 0.05, refraction of light having the first color between the buffer layer 500 and the inorganic encapsulation layer of the encapsulation layer 140 that contacts the buffer layer 500 may be minimized, therefore, the reduction in transmittance of light having the first color by the buffer layer 500 may be substantially prevented or minimized or reduced. According to some example embodiments, the refractive index of the buffer layer 500 may be greater than or equal to about 1.5 and less than or equal to about 1.9.

Figure 3:
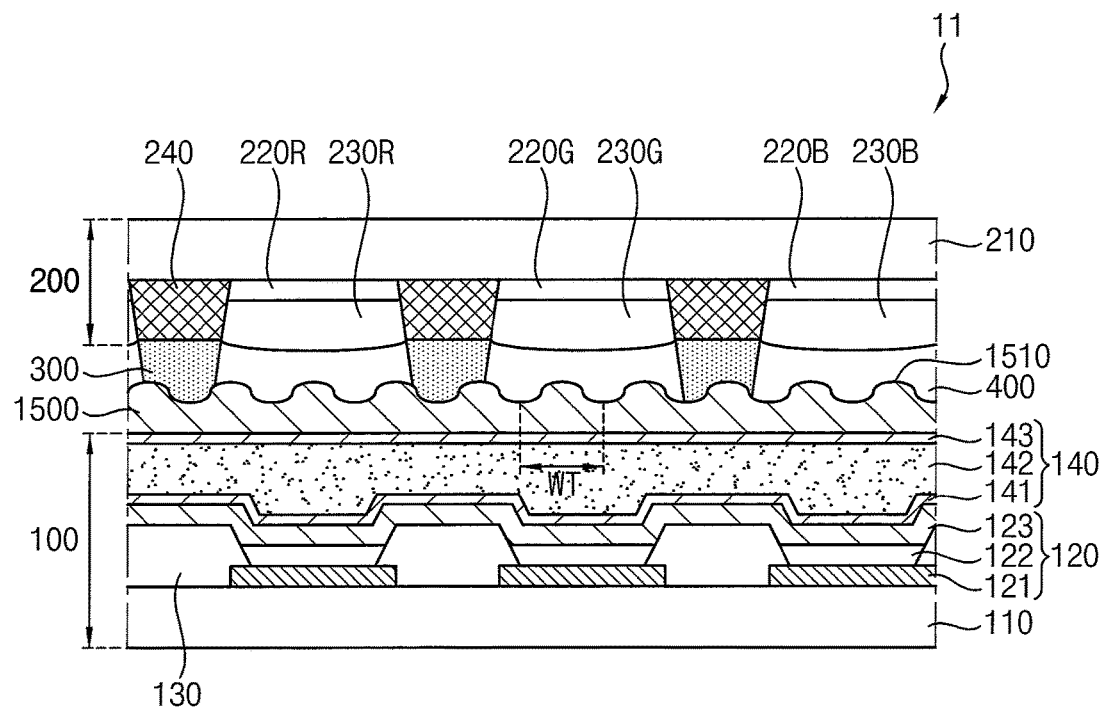
FIG. 3 is a cross-sectional view illustrating a display device according to some example embodiments.

FIG. 3 is a cross-sectional view illustrating a display device according to some example embodiments.

Referring to FIG. 3, a display device 11 according to some example embodiments may include a display panel 100, a color conversion panel 200, a column spacer 300, a filling layer 400, and a buffer layer 1500. The display device 11 described with reference to FIG. 3 may be substantially the same as or similar to the display device 10 described with reference to FIG. 2 except for a structure of an upper surface 1510 of the buffer layer 1500. Accordingly, some repetitive descriptions of certain elements may be omitted.

Wrinkles may be formed on a surface of the buffer layer 1500 that contacts the column spacer 300. According to some example embodiments, the upper surface 1510 of the buffer layer 1500 may contact the column spacer 300, and wrinkles may be formed on the upper surface 1510 of the buffer layer 1500. Because the wrinkles are formed on the surface of the buffer layer 1500 that contacts the column spacer 300, the buffer characteristics of the buffer layer 1500 with respect to the column spacer 300 may be improved.

According to some example embodiments, an average width WT of the wrinkles formed on the upper surface 1510 of the buffer layer 1500 may be about 0.01 µm to about 5 µm. The average width WT of the wrinkles may refer to an average value of a maximum width of a protruded portion in the cross-sectional shape of the wrinkles, which includes alternately arranged protruded portion and depressed portion, or an average value of a distance between the lowest point of one depressed portion and the lowest point of the depressed portion adjacent thereto. A transmittance of the buffer layer 1500 may be reduced when the average width WT of the wrinkles is less than about 0.01 µm, and there may be substantially no improvement in the buffer characteristics of the buffer layer 1500 due to the wrinkles when the average width WT of the wrinkles is greater than about 5 µm.

Figure 4:
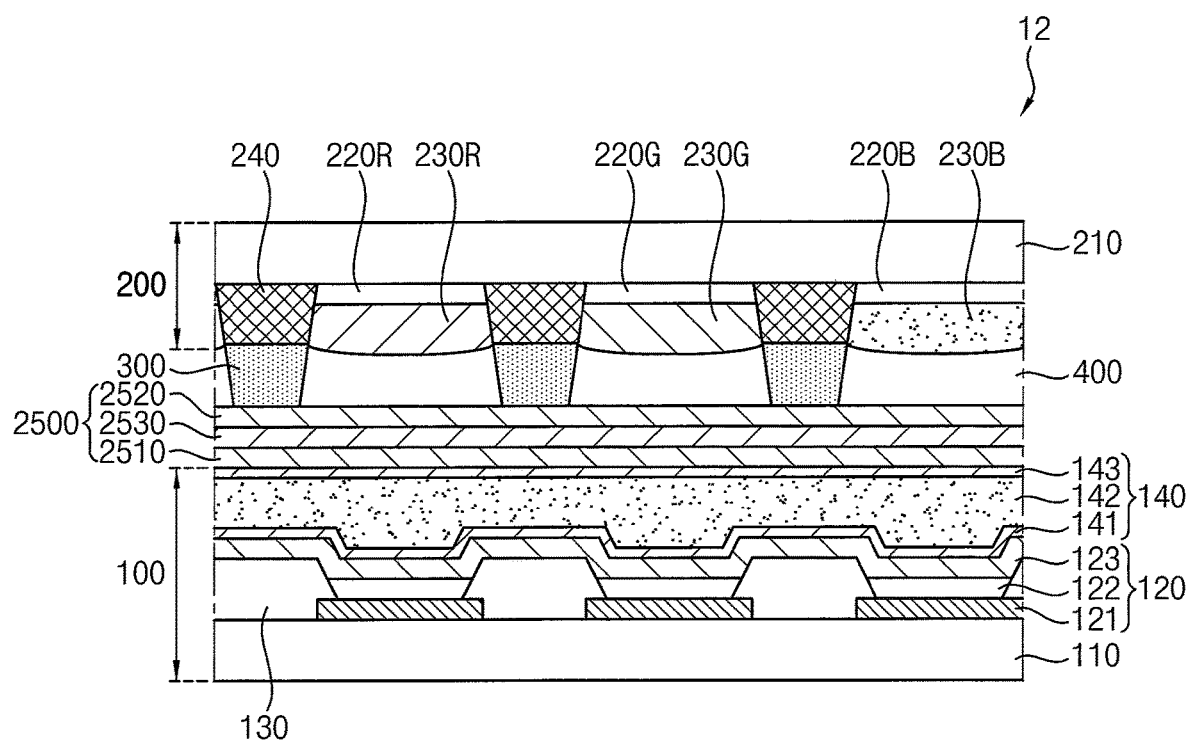
FIG. 4 is a cross-sectional view illustrating a display device according to some example embodiments.

FIG. 4 is a cross-sectional view illustrating a display device according to some example embodiments.

Referring to FIG. 4, a display device 12 according to some example embodiments may include a display panel 100, a color conversion panel 200, a column spacer 300, a filling layer 400, and a buffer layer 2500. The display device 12 described with reference to FIG. 4 may be substantially the same as or similar to the display device 10 described with reference to FIG. 2 except for a structure of the buffer layer 2500. Accordingly, some repetitive descriptions of certain elements may be omitted.

The buffer layer 2500 may have a multilayer structure including a plurality of sub-buffer layers. According to some example embodiments, the buffer layer 2500 may include a first sub-buffer layer 2510 that contacts the encapsulation layer 140 of the display panel 100, a second sub-buffer layer 2520 that contacts the column spacer 300, and a third sub-buffer layer 2530 arranged or formed between the first sub-buffer layer 2510 and the second sub-buffer layer 2520. However, embodiments according to the present invention are not limited thereto, and the buffer layer 2500 may include two sub-buffer layers or four or more sub-buffer layers.

The first sub-buffer layer 2510, the second sub-buffer layer 2520, and the third sub-buffer layer 2530 may have a first elastic modulus, a second elastic modulus, and the third elastic modulus, respectively.

According to some example embodiments, the third elastic modulus of the third sub-buffer layer 2530 may be greater than the first elastic modulus of the first sub-buffer layer 2510 and the second elastic modulus of the second sub-buffer layer 2520. For example, the first elastic modulus may be less than about 1.5 GPa, the second elastic modulus may be less than about 1.0 GPa, and the third elastic modulus may be greater than about 2.0 GPa. Because the first elastic modulus of the first sub-buffer layer 2510 and the second elastic modulus of the second sub-buffer layer 2520 are relatively small, the first sub-buffer layer 2510 that contacts the encapsulation layer 140 of the display panel 100 may serve as a buffer member with respect to the encapsulation layer 140 of the display panel 100, and the second sub-buffer layer 2520 that contacts the column spacer 300 may serve as a buffer member with respect to the column spacer 300. Further, because the third elastic modulus of the third sub-buffer layer 2530 is relatively large, the third sub-buffer layer 2530 arranged or formed between the first sub-buffer layer 2510 and the second sub-buffer layer 2520 may serve to maintain the shape of the buffer layer 2500.

According to some example embodiments, the second elastic modulus of the second sub-buffer layer 2520 may be less than the first elastic modulus of the first sub-buffer layer 2510. In a process of combining the display panel 100 to the color conversion panel 200 on which the column spacer 300 is formed, because a pressure by the column spacer 300 is greater than a pressure by the display panel 100, the second elastic modulus of the second sub-buffer layer 2520 that contacts the column spacer 300 may be less than the first elastic modulus of the first sub-buffer layer 2510 that contacts the encapsulation layer 140 of the display panel 100.

Figure 5:
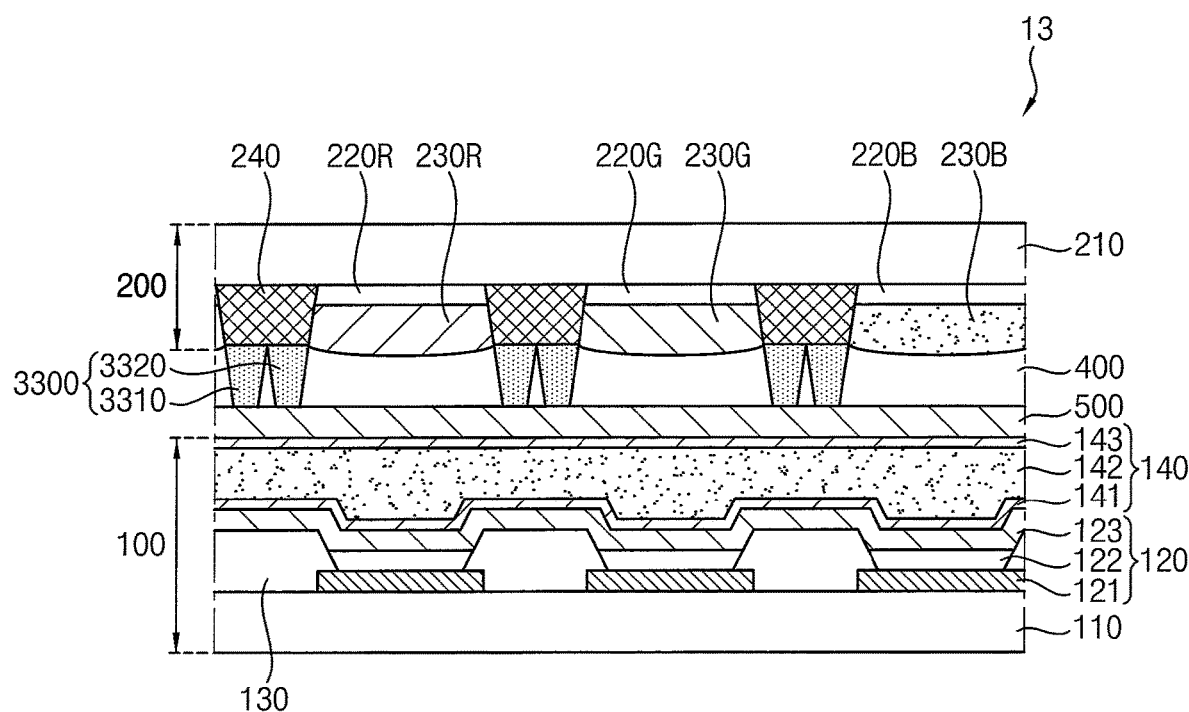
FIG. 5 is a cross-sectional view illustrating a display device according to some example embodiments.

FIG. 5 is a cross-sectional view illustrating a display device according to some example embodiments.

Referring to FIG. 5, a display device 13 according to some example embodiments may include a display panel 100, a color conversion panel 200, a column spacer 3300, a filling layer 400, and a buffer layer 500. The display device 13 described with reference to FIG. 5 may be substantially the same as or similar to the display device 10 described with reference to FIG. 2 except for a structure of the column spacer 3300. Accordingly, some repetitive descriptions of certain elements may be omitted.

The column spacer 3300 may include a plurality of sub-column spacers. The sub-column spacers may be arranged or formed adjacent to each other. According to some example embodiments, the column spacer 3300 may include a first sub-column spacer 3310 and a second sub-column spacer 3320 adjacent to the first sub-column spacer 3310. However, embodiments according to the present invention are not limited thereto, and the column spacer 3300 may include three or more sub-column spacers.

According to some example embodiments, each the first sub-column spacer 3310 and the second sub-column spacer 3320 may have a trapezoidal cross-sectional shape. For example, each the first sub-column spacer 3310 and the second sub-column spacer 3320 may have a trapezoidal shape whose width decreases in a direction from the color conversion panel 200 to the display panel 100 in a cross-sectional view.

Because the column spacer 3300 includes the plurality of sub-column spacers, a pressure applied to the buffer layer 500 from the column spacer 3300 may be dispersed. Further, a contact area between the column spacer 3300 and the buffer layer 500 may decrease, and thus, the pressure applied to the buffer layer 500 from the column spacer 3300 may decrease.

Figure 6:
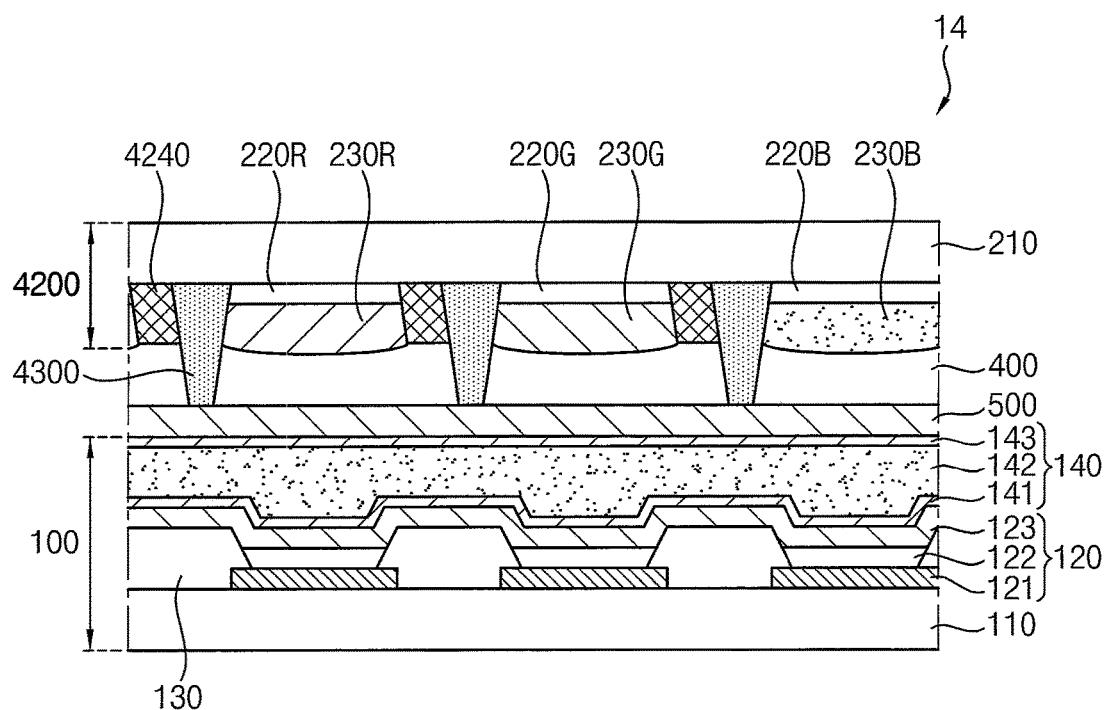
FIG. 6 is a cross-sectional view illustrating a display device according to some example embodiments.

FIG. 6 is a cross-sectional view illustrating a display device according to some example embodiments.

Referring to FIG. 6, a display device 14 according to some example embodiments may include a display panel 100, a color conversion panel 4200, a column spacer 4300, a filling layer 400, and a buffer layer 500. The display device 14 described with reference to FIG. 6 may be substantially the same as or similar to the display device 10 described with reference to FIG. 2 except for a position of the column spacer 4300. Accordingly, some repetitive descriptions of certain elements may be omitted.

The column spacer 4300 may be arranged or formed between the color conversion element 230R, 230G, and 230B of the color conversion panel 4200 and the black matrix 4240. The column spacer 4300 may be surrounded by the color conversion element 230R, 230G, and 230B and the black matrix 4240 in a plan view, and may be arranged or formed between the base substrate 210 of the color conversion panel 4200 and the buffer layer 500. In this case, the column spacer 4300 may be formed on the base substrate 210 in a process of manufacturing the color conversion panel 4200.

Figure 7:
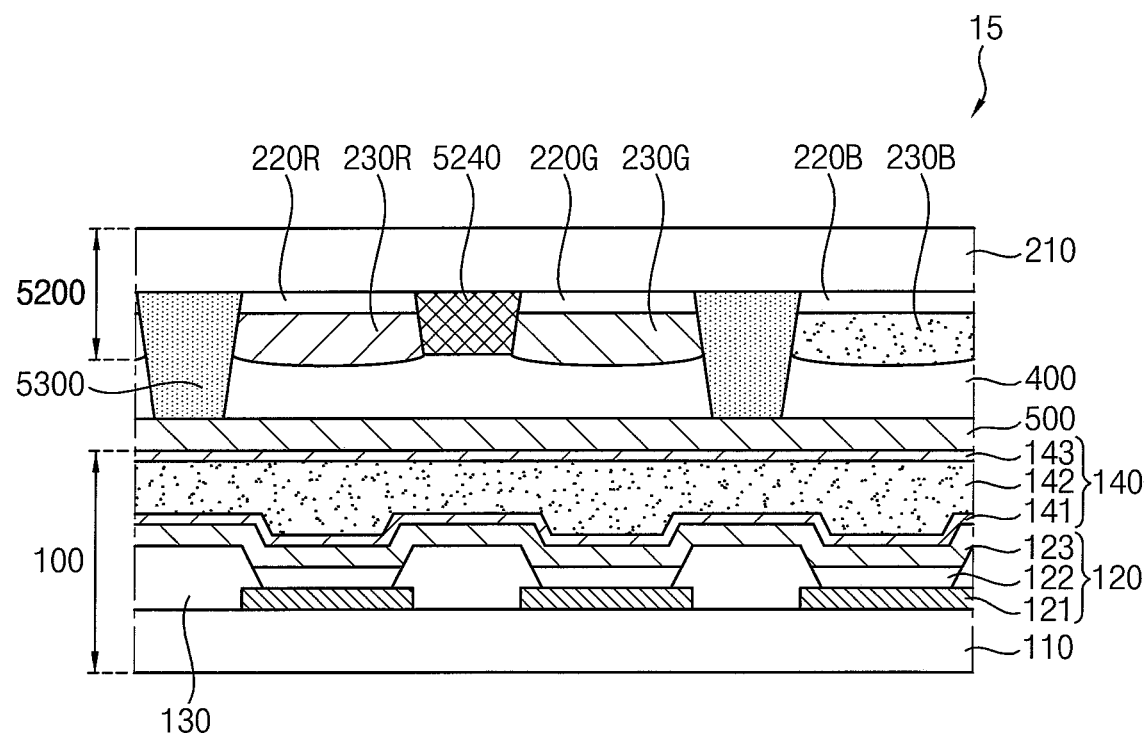
FIG. 7 is a cross-sectional view illustrating a display device according to some example embodiments.

FIG. 7 is a cross-sectional view illustrating a display device according to some example embodiments.

Referring to FIG. 7, a display device 15 according to some example embodiments may include a display panel 100, a color conversion panel 5200, a column spacer 5300, a filling layer 400, and a buffer layer 500. The display device 15 described with reference to FIG. 7 may be substantially the same as or similar to the display device 10 described with reference to FIG. 2 except for a position of the column spacer 5300. Accordingly, some repetitive descriptions of certain elements may be omitted.

According to some example embodiments, the black matrix 5240 may be arranged or formed on one of between the first color conversion element 230R and the second color conversion element 230G, between the second color conversion element 230G and the third color conversion element 230B, and between the third color conversion element 230B and the first color conversion element 230R, and the column spacer 5300 may be arranged or formed on the others of between the first color conversion element 230R and the second color conversion element 230G, between the second color conversion element 230G and the third color conversion element 230B, and between the third color conversion element 230B and the first color conversion element 230R. However, embodiments according to the present invention are not limited thereto, and according to some example embodiments, the black matrix 5240 may be arranged or formed on two of between the first color conversion element 230R and the second color conversion element 230G, between the second color conversion element 230G and the third color conversion element 230B, and between the third color conversion element 230B and the first color conversion element 230R, and the column spacer 5300 may be arranged or formed on the other of between the first color conversion element 230R and the second color conversion element 230G, between the second color conversion element 230G and the third color conversion element 230B, and between the third color conversion element 230B and the first color conversion element 230R.

Figure 8:
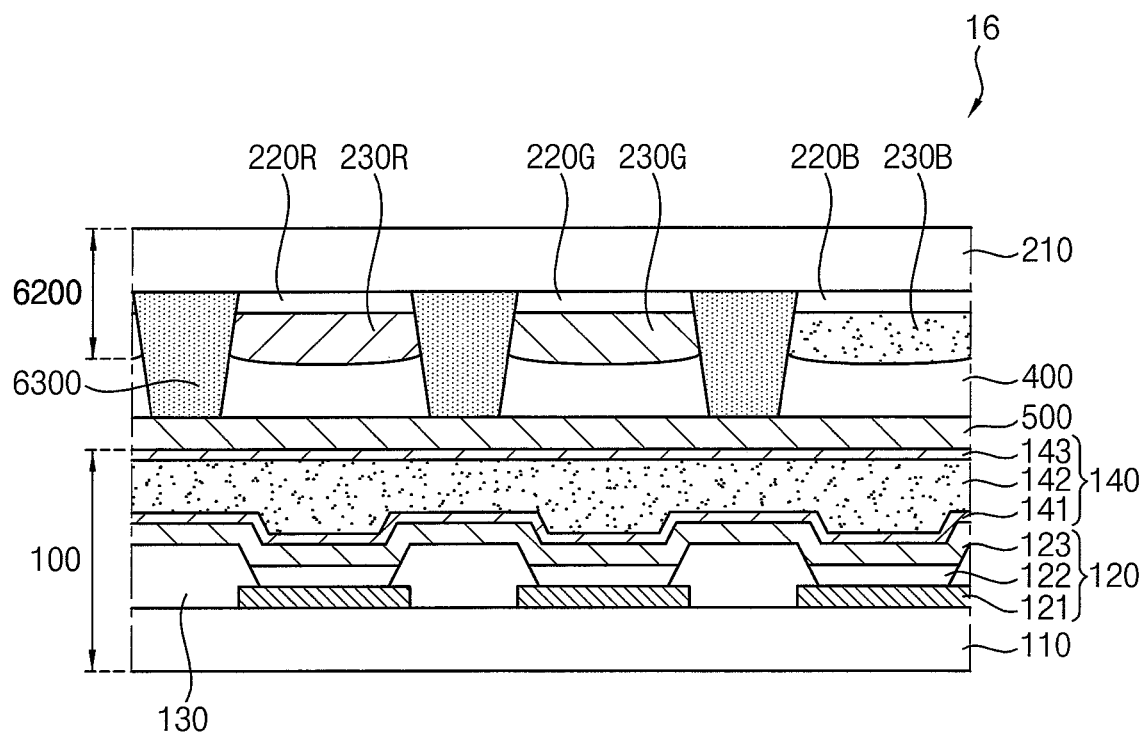
FIG. 8 is a cross-sectional view illustrating a display device according to some example embodiments.

FIG. 8 is a cross-sectional view illustrating a display device according to some example embodiments.

Referring to FIG. 8, a display device 16 according to some example embodiments may include a display panel 100, a color conversion panel 6200, a column spacer 6300, a filling layer 400, and a buffer layer 500. The display device 16 described with reference to FIG. 8 may be substantially the same as or similar to the display device 10 described with reference to FIG. 2 except for a position of the column spacer 6300. Accordingly, some repetitive descriptions of certain elements may be omitted.

The column spacer 6300 may be arranged or formed between the color conversion elements 230R, 230G, and 230B, and may overlap the pixel defining layer 130. According to some example embodiments, the color conversion panel 6200 may not include the black matrix, and the column spacer 6300 may replace the black matrix. In this case, the column spacer 6300 may block light incident thereto. For example, the column spacer 6300 may include carbon black, chromium oxide, or the like.

Figure 9:
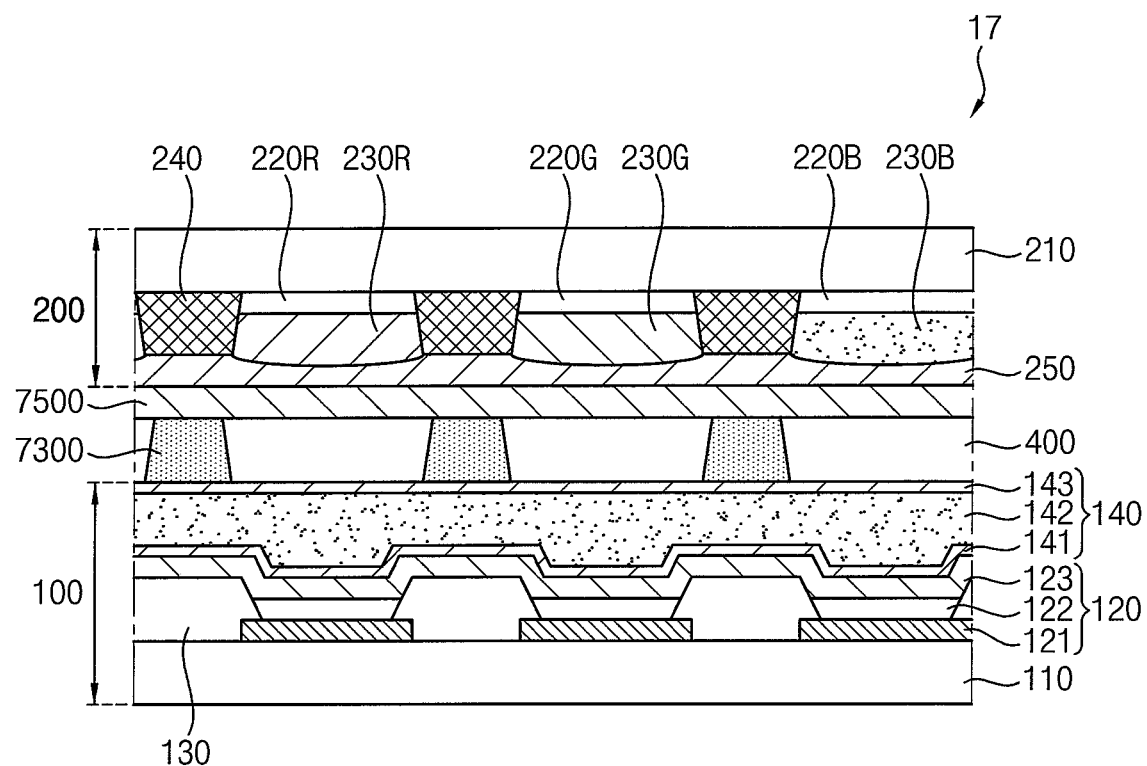
FIG. 9 is a cross-sectional view illustrating a display device according to some example embodiments.

FIG. 9 is a cross-sectional view illustrating a display device according to some example embodiments.

Referring to FIG. 9, a display device 17 according to some example embodiments may include a display panel 100, a color conversion panel 200, a column spacer 7300, a filling layer 400, and a buffer layer 7500. The display device 17 described with reference to FIG. 9 may be substantially the same as or similar to the display device 10 described with reference to FIG. 2 except for a position of the column spacer 7300 and a position of the buffer layer 7500. Accordingly, some repetitive descriptions of certain elements may be omitted.

The color conversion panel 200 may further include a protective layer 250. The protective layer 250 may cover the color conversion elements 230R, 230G, and 230B and the black matrix 240. According to some example embodiments, the protective layer 250 may include at least one of silicon nitride, silicon oxide, or silicon oxynitride.

The protective layer 250 may prevent or reduce instances of the color conversion elements 230R, 230G, and 230B being damaged by processes after forming the color conversion elements 230R, 230G, and 230B. For example, an emitter and a scatterer included in the color conversion elements 230R, 230G, and 230B may be damaged in the processes after forming the color conversion elements 230R, 230G, and 230B, however, the protective layer 250 may prevent or reduce the damage of the emitter and the scatterer.

The column spacer 7300 may be arranged or formed between the encapsulation layer 140 of the display panel 100 and the buffer layer 7500. The column spacer 7300 may be formed on the encapsulation layer 140 in a process of manufacturing the display panel 100.

According to some example embodiments, the column spacer 7300 may have a trapezoidal cross-sectional shape. For example, the column spacer 7300 may have a trapezoidal shape whose width increases in a direction from the color conversion panel 200 to the display panel 100 in a cross-sectional view.

The display panel 100 and the color conversion panel 200 may be pressed with a filler in between after the filler is applied between the display panel 100 on which the column spacer 7300 is formed and the color conversion panel 200 to form the display device 17 in which the display panel 100 and the color conversion panel 200 maintain a constant distance by the column spacer 7300 and the filling layer 400 is formed between the display panel 100 and the color conversion panel 200. In this case, the column spacer 7300 may contact the protective layer 250 of the color conversion panel 200, and dent defects may occur in the protective layer 250 as the protective layer 250 is stabbed by the column spacer 7300. To prevent or reduce instances of dent defects in the protective layer 250 of the color conversion panel 200, the buffer layer 7500 may be arranged or formed between the column spacer 7300 and the color conversion panel 200.

The buffer layer 7500 may be arranged or formed between the column spacer 7300 and the protective layer 250 of the color conversion panel 200. The buffer layer 7500 may include silicon oxycarbide ($SiO_xC_y$). The buffer layer 7500 may serve as a buffer member that blocks or absorbs an impact to the protective layer 250 of the color conversion panel 200 by the column spacer 7300.

The buffer layer 7500 may be formed on the protective layer 250 of the color conversion panel 200 before the display panel 100 and the color conversion panel 200 are combined.

The display device according to some example embodiments may be applied to a display device included in a computer, a notebook, a mobile phone, a smartphone, a smart pad, a PMP, a PDA, an MP3 player, or the like.

Although the display device according to some example embodiments has been described with reference to the drawings, the illustrated embodiments are examples, and may be modified and changed by a person having ordinary knowledge in the relevant technical field without departing from the technical spirit described in the following claims and their equivalents.

What is claimed is:

1. A display device, comprising:
    a display panel including a light emitting element and an encapsulation layer covering the light emitting element;
    a color conversion panel overlapping the display panel, the color conversion panel including a color conversion element;
    a column spacer between the display panel and the color conversion panel;
    a filling layer filling a space between the display panel and the color conversion panel and surrounding the column spacer; and
    a buffer layer between the column spacer and the encapsulation layer of the display panel, the buffer layer including silicon oxycarbide ($SiO_xC_y$).

2. The display device of claim 1, wherein the encapsulation layer includes an inorganic encapsulation layer contacting the buffer layer, and
    wherein an elastic modulus of the buffer layer is less than an elastic modulus of the inorganic encapsulation layer.

3. The display device of claim 2, wherein a hardness of the buffer layer is less than a hardness of the inorganic encapsulation layer.

4. The display device of claim 1, wherein an elastic modulus of the buffer layer is less than or equal to 3.0 GPa.

5. The display device of claim 1, wherein a hardness of the buffer layer is less than or equal to 0.4 GPa.

6. The display device of claim 1, wherein a thickness of the buffer layer is greater than 0.5 μm.

7. The display device of claim 1, wherein the encapsulation layer includes an inorganic encapsulation layer contacting the buffer layer, and
    wherein a difference between a refractive index of the buffer layer and a refractive index of the inorganic encapsulation layer is less than 0.05.

8. The display device of claim 1, wherein a refractive index of the buffer layer is greater than or equal to 1.5 and less than or equal to 1.9.

9. The display device of claim 1, wherein an atomic ratio of oxygen to silicon in the buffer layer is greater than or equal to 0.6 and less than or equal to 0.63.

10. The display device of claim 1, wherein an atomic ratio of carbon to silicon in the buffer layer is greater than or equal to 1.24 and less than or equal to 1.30.

11. The display device of claim 1, wherein wrinkles are formed on a surface of the buffer layer that contacts the column spacer.

12. The display device of claim 11, wherein an average width of the wrinkles is 0.01 μm to 5 μm.

13. The display device of claim 1, wherein the buffer layer includes:
    a first sub-buffer layer contacting the encapsulation layer and having a first elastic modulus;
    a second sub-buffer layer contacting the column spacer and having a second elastic modulus; and
    a third sub-buffer layer between the first sub-buffer layer and the second sub-buffer layer, and the third sub-buffer layer having a third elastic modulus greater than the first elastic modulus and the second elastic modulus.

14. The display device of claim 13, wherein the second elastic modulus is less than the first elastic modulus.

15. The display device of claim 1, wherein the column spacer includes a plurality of sub-column spacers.

16. The display device of claim 1, wherein the color conversion panel further includes black matrix surrounding the color conversion element.

17. The display device of claim 16, wherein the column spacer is between the buffer layer and the black matrix.

18. The display device of claim 16, wherein the column spacer is between the color conversion element and the black matrix.

* * * * *